United States Patent
Maleev

(10) Patent No.: US 9,076,639 B2
(45) Date of Patent: Jul. 7, 2015

(54) TRANSMISSIVE-REFLECTIVE PHOTOCATHODE

(75) Inventor: Ivan Maleev, Pleasanton, CA (US)

(73) Assignee: KLA-Tencor Corporation, Milpitas, CA (US)

(*) Notice: Subject to any disclaimer, the term of this patent is extended or adjusted under 35 U.S.C. 154(b) by 331 days.

(21) Appl. No.: 13/638,124

(22) PCT Filed: Sep. 6, 2012

(86) PCT No.: PCT/US2012/053870
§ 371 (c)(1), (2), (4) Date: Feb. 5, 2013

(87) PCT Pub. No.: WO2013/036576
PCT Pub. Date: Mar. 14, 2013

(65) Prior Publication Data
US 2013/0126705 A1 May 23, 2013

Related U.S. Application Data

(60) Provisional application No. 61/531,846, filed on Sep. 7, 2011.

(51) Int. Cl.
*H01J 40/06* (2006.01)
*G01J 1/44* (2006.01)
*H01L 27/146* (2006.01)

(52) U.S. Cl.
CPC . *H01J 40/06* (2013.01); *G01J 1/44* (2013.01); *H01L 27/146* (2013.01)

(58) Field of Classification Search
CPC .......... H01J 40/06; G01J 1/44; H01L 27/146
USPC .......................................... 250/207; 313/524
See application file for complete search history.

(56) References Cited

U.S. PATENT DOCUMENTS

| | | | |
|---|---|---|---|
| 3,243,626 | A | 3/1966 | Helvy et al. |
| 3,932,883 | A | 1/1976 | Rowland et al. |
| 3,978,360 | A | 8/1976 | Fletcher et al. |
| 4,099,198 | A | 7/1978 | Howorth et al. |
| 4,730,141 | A | 3/1988 | Tosswill |
| 5,982,094 | A | 11/1999 | Niigaki et al. |
| 6,831,341 | B2 | 12/2004 | Kan et al. |
| 6,908,355 | B2 | 6/2005 | Habib et al. |
| 7,795,608 | B2 | 9/2010 | Hirohata et al. |
| 2005/0045866 | A1 | 3/2005 | Kan et al. |
| 2007/0034987 | A1 * | 2/2007 | Costello et al. ............... 257/532 |

(Continued)

FOREIGN PATENT DOCUMENTS

WO   WO 94/01882 A1   1/1994

*Primary Examiner* — Seung C Sohn
(74) *Attorney, Agent, or Firm* — Suiter Swantz pc llo

(57) ABSTRACT

The present invention includes a transmissive-reflective photocathode including a membrane configured to absorb photons from an illumination source via a first surface of the membrane, the membrane further configured to emit photoelectrons in a reflection mode via the first surface, the membrane further configured to emit photoelectrons in a transmissive mode via a second surface, the first surface and the second surface being substantially parallel, and a membrane support structure configured to mechanically secure the membrane, the membrane support structure further configured to provide at least a first pathway between the first surface and free space and a second pathway between the second surface and free space.

46 Claims, 5 Drawing Sheets

(56) References Cited

U.S. PATENT DOCUMENTS

| | | |
|---|---|---|
| 2008/0042563 A1* | 2/2008 | Niigaki et al. ............... 313/542 |
| 2008/0237771 A1* | 10/2008 | Pilla et al. .................... 257/458 |
| 2008/0291454 A1 | 11/2008 | Cai et al. |
| 2010/0096985 A1 | 4/2010 | Watase et al. |
| 2010/0253218 A1 | 10/2010 | Yamashita et al. |

* cited by examiner

TRANSMISSIVE-REFLECTIVE PHOTOCATHODE

CROSS-REFERENCE TO RELATED APPLICATION

The present application is related to and claims the benefit of the earliest available effective filing date(s) from the following listed application(s) (the "Related Applications") (e.g., claims earliest available priority dates for other than provisional patent applications or claims benefits under 35 USC §119(e) for provisional patent applications, for any and all parent, grandparent, great-grandparent, etc. applications of the Related Application(s)).

RELATED APPLICATIONS

For purposes of the USPTO extra-statutory requirements, the present application constitutes a regular (non-provisional) patent application of United States Provisional Patent Application entitled TRANSMISSIVE-REFLECTIVE MEMBRANE PHOTOCATHODE, naming Ivan Maleev as inventor, filed Sep. 7, 2011, Application Ser. No. 61/531,846.

TECHNICAL FIELD

The present invention generally relates to a photocathode, and more particularly, to a membrane-based photocathode suitable for both transmitting and reflecting photoelectrons, upon absorption of incident photons.

BACKGROUND

As demand for semiconductor devices increase the need for improved device inspection capabilities will also continue to increase. One technology commonly utilized in optical inspection methodologies includes the implementation of a photocathode. In a general sense, a photocathode emits photoelectrons in response to the absorption of photons impinging on the photocathode. One commonly implemented design includes the deposition of photocathode material on a supporting substrate surface having an index of refraction different than the photocathode material. A typical photocathode includes either a transmissive based photocathode or a reflective based photocathode. In a transmissive based photocathode, incident photons must travel through the substrate material before they impinge on the photocathode material. In a reflective based photocathode, incident photons travel through the active photocathode area and then reflect off of the substrate-cathode interface and travel back through the photocathode area prior to the emission of photoelectrons from the surface of the photocathode surface. Both the reflective and transmissive configurations lead to efficiency losses in the photon-photoelectron conversion process.

Therefore, it is desirable to create a photocathode and photocathode implementing systems that cure the defects of the prior art, thereby providing a photocathode optical architecture having improved efficiency characteristics relative to the prior art.

SUMMARY

A transmissive-reflective (TR) photocathode is disclosed. In one aspect, the TR photocathode may include, but is not limited to, a membrane configured to absorb photons from an illumination source via a first surface of the membrane, the membrane further configured to emit photoelectrons in a reflection mode via the first surface, the membrane further configured to emit photoelectrons in a transmissive mode via a second surface, the first surface and the second surface being substantially parallel; and a membrane support structure configured to mechanically secure the membrane, the membrane support structure further configured to provide at least a first pathway between the first surface and free space and a second pathway between the second surface and free space.

A photomultiplier tube (PMT) detector equipped with a transmissive-reflective (TR) photocathode is disclosed. In one aspect, the PMT detector may include, but is not limited to, a transmissive-reflective (TR) photocathode comprising: a membrane configured to absorb photons from an illumination source via a first surface of the membrane, the membrane further configured to emit photoelectrons in a reflection mode via the first surface, the membrane further configured to emit photoelectrons in a transmissive mode via a second surface, the first surface and the second surface being substantially parallel; and membrane support structure configured to mechanically secure the membrane, the membrane support structure further configured to provide at least a first pathway between the first surface and free space and a second pathway between the second surface and free space; a first set of dynode stages configured to receive reflective mode photoelectrons emanating from the first surface of the membrane of the TR photocathode, the first set of dynodes further configured to generate an amplified photoelectron current in a reflective channel of the PMT detector, the first set of dynode stages further configured to direct the amplified reflective photoelectron current onto an anode; and a second set of dynode stages configured to receive transmissive mode photoelectrons emanating from the second surface of the membrane of the TR photocathode, the second set of dynodes further configured to generate an amplified photoelectron current in a transmissive channel of the PMT detector, the second set of dynode stages further configured to direct the amplified transmissive channel photoelectron current onto the anode.

An image intensifier equipped with a transmissive-reflective (TR) photocathode is disclosed. In one aspect, the image intensifier may include, but is not limited to, a first chamber; a second chamber; a transmissive-reflective (TR) photocathode disposed between the first chamber and the second chamber, the TR photocathode comprising: a membrane configured to absorb photons of an illumination beam from an illumination source via a first surface of the membrane, the membrane further configured to emit photoelectrons in a reflection mode via the first surface into the first chamber, the membrane further configured to emit photoelectrons in a transmissive mode via a second surface into the second chamber, the first surface and the second surface being substantially parallel; and a membrane support structure configured to mechanically secure the membrane, the membrane support structure further configured to provide at least a first pathway between the first surface and the first chamber and a second pathway between the second surface and the second chamber; a first scintillator screen configured to receive reflective mode photoelectrons emanating from the first surface of the membrane of the TR photocathode; a second scintillator screen configured to receive transmissive mode photoelectrons emanating from the second surface of the membrane of the TR photocathode.

An electron bombardment sensor equipped with a transmissive-reflective (TR) photocathode is disclosed. In one aspect, the electron bombardment sensor may include, but is not limited to, a first chamber; a second chamber; a transmissive-reflective (TR) photocathode disposed between the first chamber and the second chamber, the TR photocathode comprising: a membrane configured to absorb photons of an illumination beam from an illumination source via a first surface of the membrane, the membrane further configured to emit photoelectrons in a reflection mode via the first surface into the first chamber, the membrane further configured to emit photoelectrons in a transmissive mode via a second surface into the second chamber, the first surface and the second surface being substantially parallel; and a membrane support structure configured to mechanically secure the membrane, the membrane support structure further configured to provide at least a first pathway between the first surface and the first chamber and a second pathway between the second surface and the second chamber; a first detector configured to receive reflective mode photoelectrons emanating from the first surface of the membrane of the TR photocathode; a second detector configured to receive transmissive mode photoelectrons emanating from the second surface of the membrane of the TR photocathode.

An inspection system equipped with a TR photocathode based photomultiplier tube detector is disclosed. The inspection system may include, but is not limited to, an illumination source configured to illuminate a portion of a sample surface; a set of illumination optics configured to direct and focus the illumination onto the sample surface; a transmissive-reflective photocathode (TRP) based sensor configured to detect at least a portion of light scattered from the surface of the sample; and a set of collection optics configured to direct and focus at least a portion of light scattered from the surface of the sample onto the TR photocathode of TRP based sensor. In a further aspect, the TRP based sensor may include, but is not limited to, a TRP based photomultiplier tube, a TRP based image intensifier, or a TRP based electron bombardment sensor.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Reference will now be made in detail to the subject matter disclosed, which is illustrated in the accompanying drawings.

Referring generally to FIGS. 1 through 5, a transmissive-reflective photocathode 100 is described in accordance with the present invention. The present disclosure is directed to a transmissive-reflective photocathode 100 suitable emitting transmissive mode photoelectrons and reflective mode photoelectrons in response to the absorption of an incident photon. The transmissive-reflective photocathode 100 provides an optical architecture implementable in an electron-optical photon multiplier (e.g., photomultiplier tube (PMT)) detector, whereby a quantum efficiency greater than 90% may be achievable due to the dual transmissive-reflective nature of the photocathode 100. In this sense, the high quantum efficiency of the device may be achieved as a result of the emitted photoelectrons being emitted into free space in both the transmissive and reflective directions, improving upon the prior art outlined previously herein. In turn, the enhanced quantum efficiency of the transmissive-reflective photocathode based detector provides improved sensitivity to microscopic particles. The transmissive-reflective photocathode 100 of the present invention further provides an optical architecture for implementation image intensive and electron bombardment sensor. As such, an inspection tool (e.g., dark field inspection tool or bright field inspection tool) implementing a detector based on transmissive-reflective photocathode 100 of the present invention may serve critical in achieving the enhanced sensitivity levels required for 1×78 and 1×80 nodes.

Figure 1:
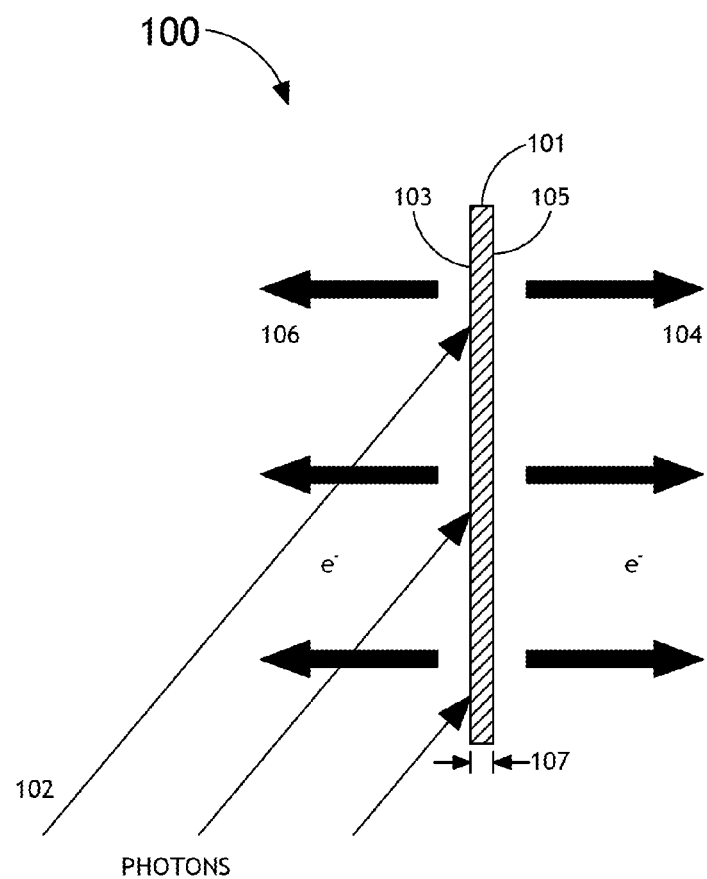
FIG. 1 illustrates a simplified schematic view of transmissive-reflective photocathode, in accordance with an embodiment of the present invention.

FIG. 1 illustrates a transmissive-reflective (TR) photocathode 100, in accordance with an embodiment of the present invention. In one aspect, the TR photocathode 100 may include a membrane 101. The membrane 101 may include, but is not limited to, a first surface 103 and a second surface 105. In one embodiment, the first surface 103 and second surface 105 are arranged generally opposite to one another and are substantially parallel. In another aspect, the TR photocathode 100 may include a membrane support structure configured to mechanically secure the membrane 101. The membrane support structure 108 is further configured to provide a first pathway between the first surface 103 and free space and a second pathway between the second surface 105 and free space. In one embodiment, the membrane support structure 108 may include a through-hole, thereby exposing both the first surface 103 and second surface 105 to free space, allowing incident photons 102 to impinge on the first surface 103. The through-hole further allows reflective mode photoelectrons to be reflected from the surface 103 into free space and transmissive mode photoelectrons to be emitted from surface 105 into free space, as shown in FIG. 1. In this sense, the active photoelectron generating portions (reflective mode photoelectron generating region and the transmissive mode photoelectron generating region) of the membrane 101 are devoid of a supporting surface, allowing both reflective mode and transmissive mode photoelectrons to escape from the surface of the membrane 101.

In contrast, prior photocathodes only allowed for photoelectron emission at one surface of the photocathodes, whereby a membrane was deposited on a solid supporting surface having a different index of refraction than the membrane, allowing photoelectrons to emanate from the membrane in only a single mode (transmissive mode or reflective mode, but not both).

In one aspect of the present invention, the membrane 101 of the TR cathode 100 may include a membrane 101 having a selected thickness 107 and a selected surface area. In this regard, the material utilized to fabricate the membrane 101 may be selected such that membrane 101 possesses adequate strength to maintain structural integrity in settings where the membrane 101 has a large surface area (e.g., 25 by 25 mm or larger), but a very small thickness. In some embodiments, the thickness of the membrane 101 may be between approximately 10 nm to 1000 nm. It is noted herein that a very thin membrane 101 is desirable as it may aid in minimizing internal losses within the TR photocathode 101.

In one embodiment, the membrane 101 may be constructed of a thin sheet of material having a thickness between 10 and 1000 nm. For example, the membrane 101 may be fabricated using one or more sheets of graphene. In another embodiment, the membrane 101 may be constructed of one or more nanostructured films having a thickness between 10 and 1000 nm. For example, the membrane 101 may include a film constructed of quantum dots sufficient to absorb most or all of the incident photons. For instance, a 100 nm quantum dot based membrane may be sufficient to achieve nearly 100% photon absorption. Graphene-based membranes are described generally by S. Garag et al., "Graphene as a sub-nanometer trans-electrode membrane," Nature, Sep. 9, 2010, pp. 190-193, vol. 467, Nature Publishing Group, and J. Meyer et al., "The structure of suspended grapheme sheets," Nature, Mar. 1, 2007, pp. 60-63, vol. 446, Nature Publishing Group, which are both incorporated herein by reference in their entirety.

In a general sense, the TR photocathode 100 may be configured to absorb photons 102 from any illumination source known in the art. In one embodiment, the TR photocathode 100 may be configured to absorb photons 102 from a broad band source (e.g., xenon lamp). In another embodiment, the TR photocathode 100 may be configured to absorb photons 102 from a narrow band source. For example, the light source 102 may include one or more lasers.

Figure 2:
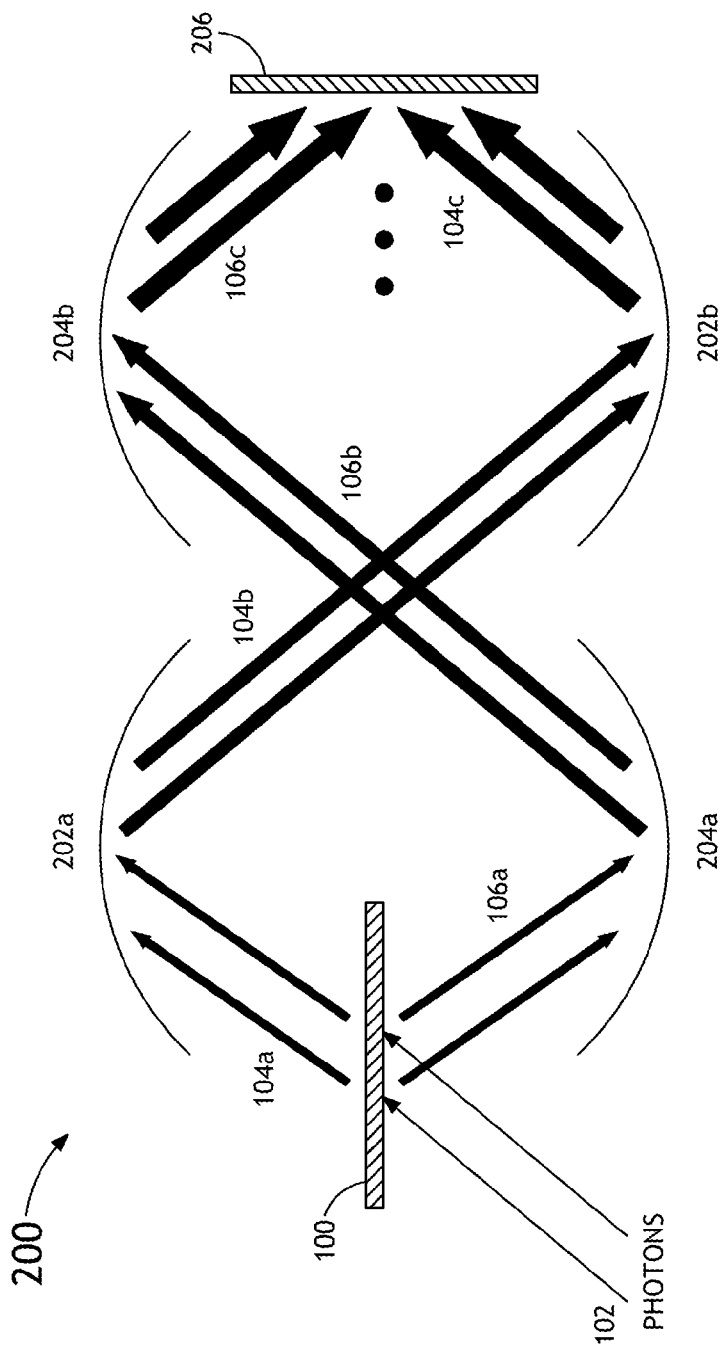
FIG. 2 illustrates a simplified schematic view of a photomultiplier tube equipped with a transmissive-reflective photocathode, in accordance with an embodiment of the present invention.

FIG. 2 illustrates a photomultiplier tube (PMT) implementing the transmissive-reflective photocathode, in accordance with an embodiment of the present invention. In one aspect, the PMT 200 includes the TR photocathode 100 described previously herein. The TR photocathode 100 includes a membrane 101 configured to absorb photons 102 from an illumination source via a first surface 103 of the membrane 105.

In another aspect, the PMT 200 may include a first set of dynode stages 204a and 204b. The first dynode stage 204a is configured to receive reflective mode photoelectrons 106a emanating from the first surface 103 of the membrane 101 of the TR photocathode 101. The first dynode stage 204a is further configured to amplify the received reflective mode photoelectron current 106a (via secondary emission) such that the photoelectron current 106b emanating from the first dynode 204a is larger than the current 106a. In turn, the next dynode 204b of the reflective mode channel may amplify the photoelectron current such that the current 106c is larger than the current 106b. This process can be carried out multiple times, thereby building up the photoelectron current to desired levels. Upon undergoing amplification at the each of the multiple dynode stages of the reflective channel, the photoelectrons associated with the reflective mode photoelectron signal may be directed by the last dynode (e.g., 204b in FIG. 2) in the series such that the amplified photoelectron output impinges on the anode 206.

In another aspect, the PMT 200 may include a second set of dynode stages 202a and 202b. The first dynode stage 202a of the second set of stages is configured to receive transmissive mode photoelectrons 104a emanating from the second surface 105 of the membrane 101 of the TR photocathode 101. The first dynode stage 202a of the second set of stages is further configured to amplify the received transmissive mode photoelectron current 104a (via secondary emission) such that the photoelectron current 104b emanating from the first dynode 202a is larger than the current 104a. In turn, the next dynode 202b of the transmissive mode channel may amplify the photoelectron current such that the current 104c is larger than the current 104b. This process can be carried out multiple times, thereby building up the photoelectron current associated with the transmissive mode to desired levels. Upon undergoing amplification at the each of the multiple dynode stages of the transmissive channel, the photoelectrons associated with the transmissive mode photoelectron signal may be directed by the last dynode (e.g., 202b in FIG. 2) in the series such that the amplified photoelectron output impinges on the anode 206.

It is noted herein that the number of dynode stages present in the reflective and transmissive channels is not limited to the number of stages illustrated in FIG. 2. The number of stages depicted in FIG. 2 is provided merely for purposes of illustration and it is contemplated that any number of stages in either the reflective or transmissive channels may be utilized in the present invention. It is further noted that the choice of the number of dynode stages may ultimately depend on required amplification levels and cost, among other factors.

In a further aspect, the anode 206 of the PMT 200 may include a phosphor anode suitable for converting absorbed electrons into light. For example, the phosphor coated anode 206 may be energized by the amplified transmissive mode electron current 202b and the amplified reflective mode current 204b, thereby emitting illumination. In a further embodiment, the PMT 200 may include a detector (not shown) configured to detect illumination emanating from the anode 206. For example, the detector may include any detector known in the art, such as but not limited to, a CCD detector, or a TDI-CCD detector.

In a further embodiment, the PMT 200 may include an optically transparent window (not shown) suitable for allowing illumination of an illumination beam 102 to be transmitted from the illumination source (not shown) to the first surface of the membrane of the TR photocathode 100. In a general sense, the photocathode 100 of the PMT 200 is configured to receive illumination transmitted through the window at oblique or at normal or near-normal incident angles.

Figure 3:
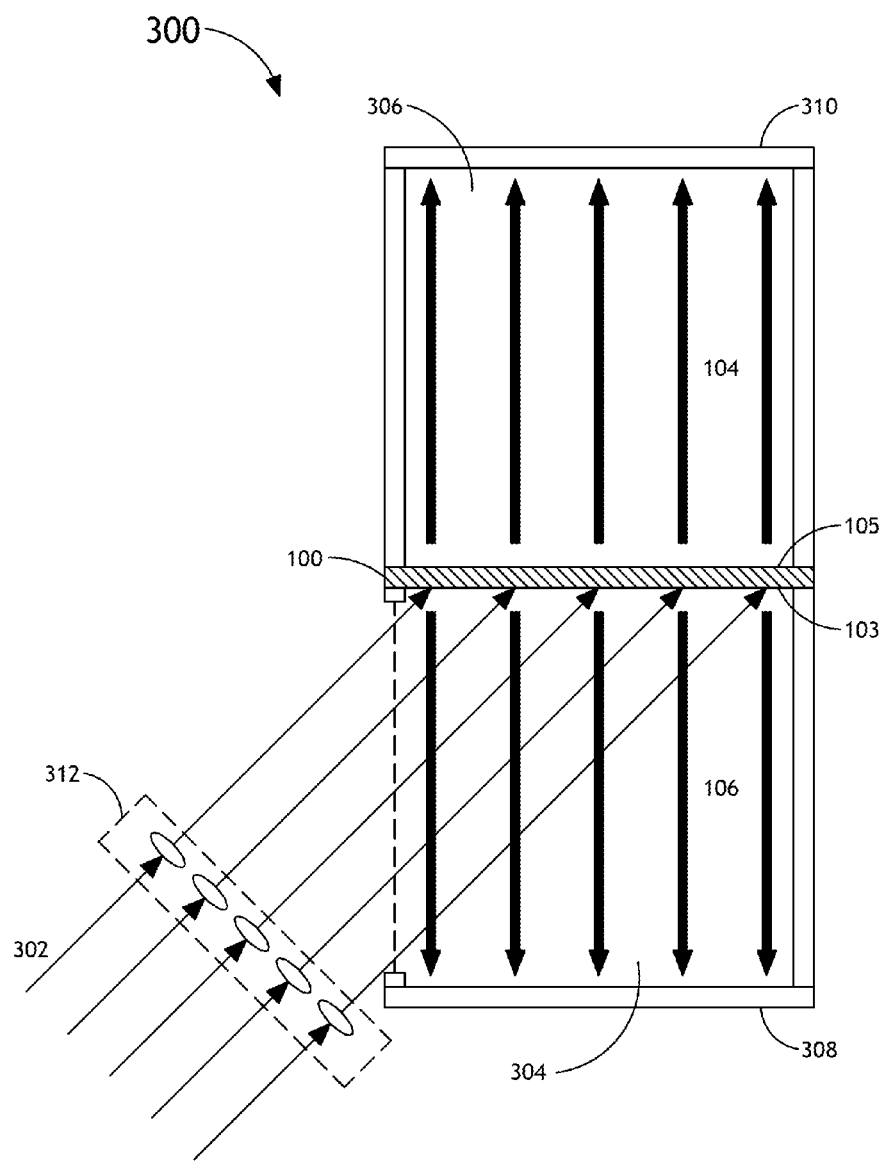
FIG. 3 illustrates a simplified schematic view of an image intensifier equipped with a transmissive-reflective photocathode, in accordance with an embodiment of the present invention.

FIG. 3 illustrates an image intensifier 300 implementing the transmissive-reflective photocathode 100 described previously herein, in accordance with one embodiment of the present invention. In one aspect, the image intensifier 300 may include a first chamber 304 and a second chamber 306. The TR photocathode 100 and therefore the membrane 101 of the photocathode are disposed between the first chamber 304 and the second chamber 306. In a further aspect, the membrane of the photocathode 100 may absorb photons of an illumination beam 302 from an illumination source (not shown) and emit reflection mode photoelectrons 106 into the first chamber 304 of the intensifier 300 and transmissive mode photoelectrons 104 into the second chamber 306 of the intensifier 300.

In a further aspect, the image intensifier 300 may include a first scintillator screen 308 positioned at the opposite end of the first chamber 304 from the first surface 103 of the TR photocathode 100. In addition, the image intensifier 300 may include a second scintillator screen 310 positioned at the opposite end of the second chamber 306 from the second surface 105 of the TR photocathode 100. In this regard, the first screen 308 may absorb photoelectrons 106 reflected from the first surface 103 of the membrane of the TR photocathode 100 and convert the absorbed photoelectrons to light. Further, the second screen 310 may absorb transmissive mode photoelectrons 104 from the second surface 105 of the membrane of the TR photocathode 100 and convert the absorbed photoelectrons 104 to light. In one embodiment, the first screen 308 and the second screen 310 may each include a phosphor screen suitable for absorbing photoelectrons (e.g., reflective mode electrons 106 or transmissive mode electrons 104) and convert them to light.

In a further embodiment, the image intensifier 300 may include a first detector (e.g., CCD detector) (not shown) configured to detect light generated by the first screen 308. Further, the image intensifier 300 may include a second detector (e.g., CCD detector) (not shown) configured to detect light generated by the second screen 310. The first detector and the second detector combined with the screens 308 and 310 allow for the imaging of both the reflective mode photoelectrons from the first surface 103 of the photocathode 100 and the transmissive mode photoelectrons from the second surface 105 of the photocathode 100.

In a further embodiment, the image intensifier 300 may include an optically transparent window 311 suitable for allowing illumination of an illumination beam 302 to be transmitted from the illumination source (not shown) to the first surface 103 of the membrane of the TR photocathode 100. In a general sense, the photocathode 100 is configured to receive illumination transmitted through the window 311 at oblique or at normal or near-normal incident angles.

In a further embodiment, the image intensifier 300 may include one or more optical elements configured to maintain focus across the first surface 103 of the photocathode 100, thereby preserving resolution of the intensifier 300. Further, the one or more optical elements 312 may include a variable focal length microarray. It is noted herein that an optical element, such as a variable focal length microarray, may be particularly advantageous because the photons 302 incident on the photocathode 100 may impinge on the photocathode 100 at oblique angles. It is further recognized that in scenarios in which the incident illumination 302 has a large depth of focus (i.e., low numerical aperture) or resolution requirements are minimal the optical element 312 may not be required.

Figure 4:
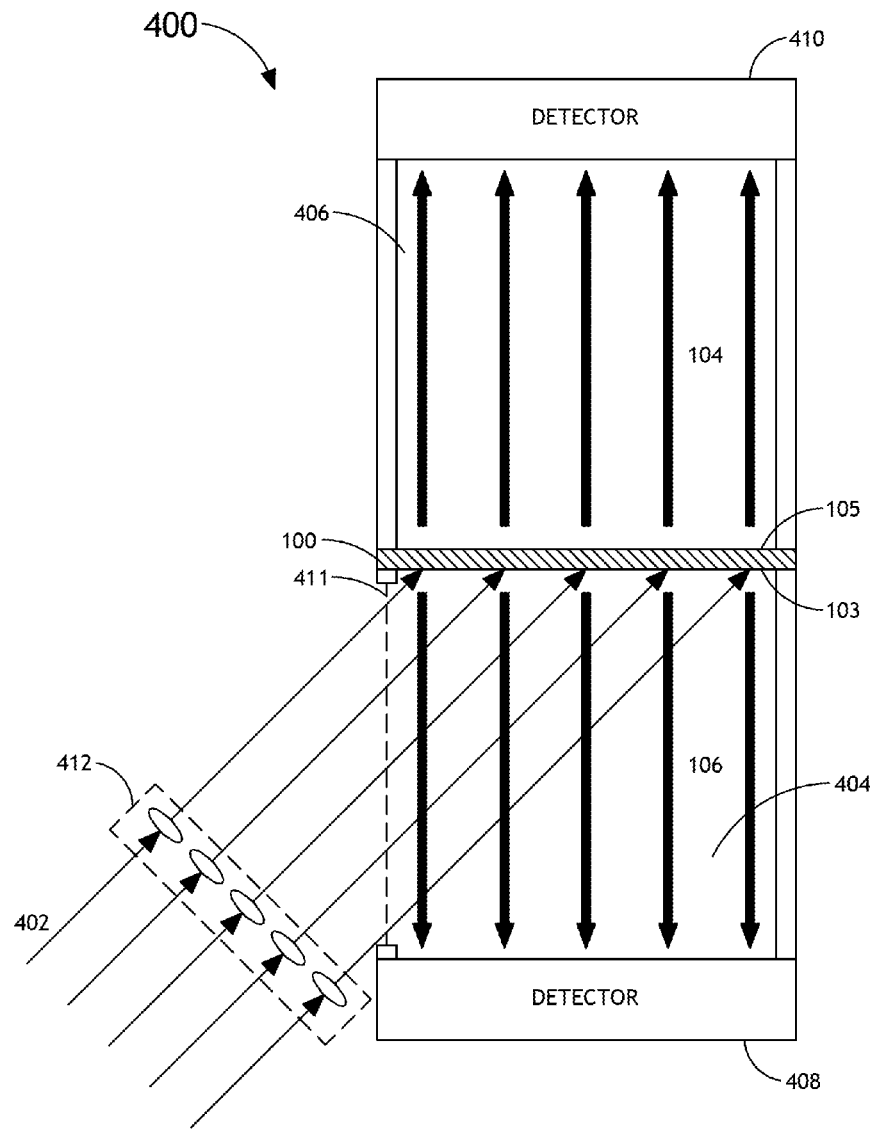
FIG. 4 illustrates a simplified schematic view of an electron bombardment (EB) sensor equipped with a transmissive-reflective photocathode, in accordance with an embodiment of the present invention.

FIG. 4 illustrates an electron bombardment (EB) image sensor 400 implementing the transmissive-reflective photocathode 100 described previously herein, in accordance with one embodiment of the present invention. In one aspect, as in the image intensifier 300 described above, the EB sensor 400 may include a first chamber 404 and a second chamber 406. The TR photocathode 100 is disposed between the first chamber 404 and the second chamber 406. In a further aspect, the membrane of the photocathode 100 may absorb photons of an illumination beam 402 from an illumination source (not shown) and emit reflection mode photoelectrons 106 into the first chamber 404 of the EB sensor 400 and transmissive mode photoelectrons 104 into the second chamber 406 of the EB sensor 400.

In a further aspect, the EB sensor 400 may include a first detector 408 positioned at the opposite end of the first chamber 404 from the first surface 103 of the TR photocathode 100. In addition, the EB sensor 400 may include a second detector 410 positioned at the opposite end of the second chamber 406 from the second surface 105 of the TR photocathode 100. In this regard, the first detector 408 may receive, or sense, photoelectrons 106 reflected from the first surface 103 of the membrane of the TR photocathode 100. Further, the second detector 410 may receive transmissive mode photoelectrons 104 from the second surface 105 of the membrane of the TR photocathode 100. In one embodiment, the first detector 408 and the second detector 410 may each include a CCD detector. In another embodiment, the first detector 408 and the second detector 410 may each include a CMOS detector.

In a further embodiment, the EB sensor 400 may include an optically transparent window suitable for allowing illumination of an illumination beam 402 to be transmitted from the illumination source (not shown) to the first surface 103 of the membrane of the TR photocathode 100. In a general sense, the photocathode 100 is configured to receive illumination transmitted through the window 411 at oblique or at normal or near-normal incident angles.

In a further embodiment, as in the intensifier 300, the EB sensor 400 may include one or more optical elements configured to maintain focus across the first surface 103 of the photocathode 100, thereby preserving resolution of the EB sensor 400. Further, the one or more optical elements 412 may include a variable focal length microarray.

It is further recognized herein that the first detector 408 and the second detector 410 may be positioned at a selected distance from the TR photocathode 100.

Figure 5:
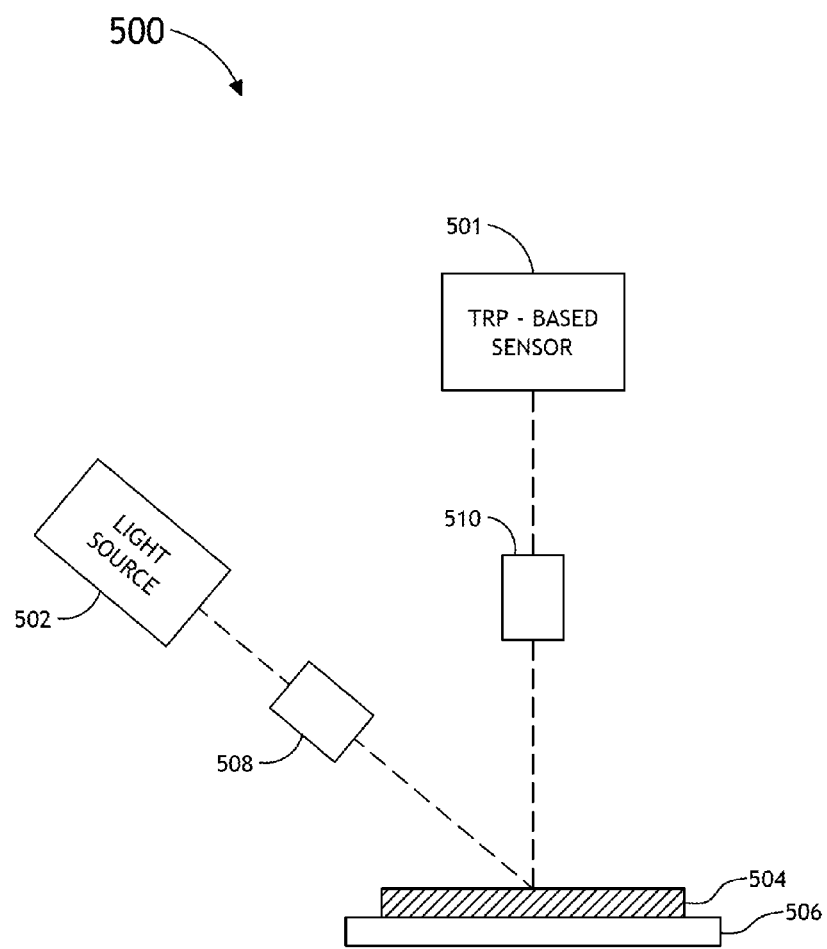
FIG. 5 illustrates a block diagram of an inspection system equipped with a transmissive-reflective photocathode based sensor, in accordance with an embodiment of the present invention.

FIG. 5 illustrates an inspection system 500 equipped with the transmissive-reflective photocathode 100, in accordance with an embodiment of the present invention. In one aspect, the inspect system 500 includes a transmissive-reflective photocathode (TRP) based sensor 501.

In one embodiment, the TRP based sensor 501 of the inspection system 500 may include a TRP-based based PMT, such as the PMT 200 as described previously in the present disclosure. In this regard, the PMT of the inspection system 500 includes a transmissive-reflective (TR) photocathode (as described previously herein); a first set of dynode stages configured to receive reflective mode photoelectrons emanating from a first surface of a membrane of the TR photocathode, the first set of dynodes further configured to generate an amplified photoelectron current in a reflective channel of the PMT detector, the first set of dynode stages further configured to direct the amplified reflective photoelectron current onto an anode; and a second set of dynode stages configured to receive transmissive mode photoelectrons emanating from a second surface of the membrane of the TR photocathode, the second set of dynodes further configured to generate an amplified photoelectron current in a transmissive channel of the PMT detector, the second set of dynode stages further configured to direct the amplified transmissive channel photoelectron current onto the anode.

In another embodiment, the TRP-based sensor 501 of the inspection system 500 may include a TRP-based image intensifier. For example, the TRP-based sensor 501 may include the TRP-based image intensifier 300 as described previously herein. In another embodiment, the TRP-based sensor 501 of the inspection system 500 may include a TRP-based electron bombardment sensor. For example, the TRP-based sensor 501 may include the TRP-based electron bombardment sensor 400 as described previously herein. It is noted herein that the description of the PMT 200, the image intensifier 300, and the electron bombardment sensor 400 provided previously herein should be interpreted to extend to the inspection system 500.

In another aspect, the inspect system 500 includes an illumination source 502 configured to illuminate a portion of a surface of a sample 504 (e.g., semiconductor wafer) disposed on a sample stage 506. In one embodiment, the illumination source 502 may include one or more broad band light sources, such as a xenon lamp. In another embodiment, the illumination source 502 may include one or more narrow band light sources, such as one or more lasers emitting light at a selected wavelength.

In another aspect, the inspection system 500 may include a set of illumination optics 508 configured to direct and focus the illumination onto the sample surface. The illumination optics 508 of the inspection system 500 may include any illumination optics known in the art suitable for directing, processing, and/or focusing the light beam emanating from the illumination source 502 on to a portion of the surface of the sample 504. For example, the set of illumination optics may include, but are not limited to, one or more lenses, one or more mirrors, one or more beam splitters, one or more polarizer elements, and the like.

In another aspect, the inspection system 500 may include a set of collection optics 510 configured to direct and focus at least a portion of the light scattered from the surface of the sample onto the TR photocathode 100 of the TRP-based sensor 501. The collection optics 510 of the inspection system 500 may include any collection optics known in the art suitable for directing, processing, and/or focusing light scattered from the surface of the sample 504 onto a detector. For example, the set of collection optics 510 may include, but are not limited to, one or more lenses, one or more mirrors, one or more beam splitters, one or more polarizer elements, and the like.

In one embodiment, it is contemplated herein that the illumination source 502, the illumination optics 508, the collection optics 510, and the TRP-based sensor 501 may be arranged in a dark field configuration such that the inspection system 500 operates as a dark field inspection system. In another embodiment, the system 500 may be configured to operate as a bright field inspection system (not shown).

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. It is believed that the present disclosure and many of its attendant advantages will be understood by the foregoing description, and it will be apparent that various changes may be made in the form, construction and arrangement of the components without departing from the disclosed subject matter or without sacrificing all of its material advantages. Furthermore, it is to be understood that the invention is defined by the appended claims.

What is claimed:

1. A photocathode, comprising:
a membrane configured to absorb photons from an illumination source via a first surface of the membrane, the membrane further configured to emit photoelectrons in a reflection mode via the first surface, the membrane further configured to emit photoelectrons in a transmissive mode via a second surface, the first surface and the second surface being substantially parallel; and
a membrane support structure configured to mechanically secure the membrane, the membrane support structure further configured to provide at least a first pathway between the first surface and free space and a second pathway between the second surface and free space.

2. The photocathode of claim 1, wherein at least a portion of the membrane includes one or more graphene sheets of a selected thickness.

3. The photocathode of claim 1, wherein at least a portion of the membrane includes at least a layer of a nanostructured film of a selected thickness.

4. The photocathode of claim 1, wherein membrane comprises:
a membrane having a selected thickness and a selected surface area.

5. The photocathode of claim 4, wherein the selected thickness is between 10 nm and 1000 nm.

6. The photocathode of claim 4, wherein the selected surface area is between 10 and 50 $mm^2$.

7. The photocathode of claim 1, wherein the illumination source is a broad band source.

8. The photocathode of claim 1, wherein the illumination source is a narrow band source.

9. A photomultiplier tube detector, comprising:
a transmissive-reflective (TR) photocathode comprising:
a membrane configured to absorb photons from an illumination source via a first surface of the membrane, the membrane further configured to emit photoelectrons in a reflection mode via the first surface, the membrane further configured to emit photoelectrons in a transmissive mode via a second surface, the first surface and the second surface being substantially parallel; and
a membrane support structure configured to mechanically secure the membrane, the membrane support structure further configured to provide at least a first pathway between the first surface and free space and a second pathway between the second surface and free space;
a first set of dynode stages configured to receive reflective mode photoelectrons emanating from the first surface of the membrane of the TR photocathode, the first set of dynodes further configured to generate an amplified photoelectron current in a reflective channel of the PMT detector, the first set of dynode stages further configured to direct the amplified reflective photoelectron current onto an anode; and
a second set of dynode stages configured to receive transmissive mode photoelectrons emanating from the second surface of the membrane of the TR photocathode, the second set of dynodes further configured to generate an amplified photoelectron current in a transmissive channel of the PMT detector, the second set of dynode stages further configured to direct the amplified transmissive channel photoelectron current onto the anode.

10. The photomultiplier tube detector of claim 9, wherein the anode comprises:
a phosphor anode configured to convert the amplified reflective channel photoelectron current and the amplified transmissive channel photoelectron current to light.

11. The photomultiplier tube detector of claim 10, further comprising:
a detector configured to detect the light generated by the phosphor anode.

12. The photomultiplier tube detector of claim 9, wherein at least a portion of the membrane includes one or more graphene sheets of a selected thickness.

13. The photomultiplier tube detector of claim 9, wherein at least a portion of the membrane includes at least a layer of a nanostructured film of a selected thickness.

14. The photomultiplier tube detector of claim 9, wherein membrane comprises:
a membrane having a selected thickness and a selected surface area.

15. The photomultiplier tube detector of claim 14, wherein the selected thickness is between 10 nm and 1000 nm.

16. The photomultiplier tube detector of claim 14, wherein the selected surface area is between 10 and 50 $mm^2$.

17. The photomultiplier tube detector of claim 1, wherein the illumination source is a broad band source.

18. The photomultiplier tube detector of claim 1, wherein the illumination source is a narrow band source.

19. The photomultiplier tube detector of claim 1, wherein the TR photocathode is configured to receive illumination from the illumination source at oblique incident angles or normal incident angles.

20. An image intensifier, comprising:
a first chamber;
a second chamber;
a transmissive-reflective (TR) photocathode disposed between the first chamber and the second chamber, the TR photocathode comprising:
a membrane configured to absorb photons of an illumination beam from an illumination source via a first surface of the membrane, the membrane further configured to emit photoelectrons in a reflection mode via the first surface into the first chamber, the membrane further configured to emit photoelectrons in a transmissive mode via a second surface into the second chamber, the first surface and the second surface being substantially parallel; and
a membrane support structure configured to mechanically secure the membrane, the membrane support structure further configured to provide at least a first pathway between the first surface and the first chamber and a second pathway between the second surface and the second chamber;
a first scintillator screen configured to receive reflective mode photoelectrons emanating from the first surface of the membrane of the TR photocathode;
a second scintillator screen configured to receive transmissive mode photoelectrons emanating from the second surface of the membrane of the TR photocathode.

21. The image intensifier of claim 20, wherein at least one of the first scintillator screen and the second scintillator screen comprises:
a phosphor screen.

22. The image intensifier of claim 20, further comprising:
a first detector configure to detect light generated by the first scintillator screen via absorption of reflection mode photoelectrons; and
a second detector configured to detect light generated by the second scintillator screen via absorption of transmissive mode photoelectrons.

23. The image intensifier of claim 20, wherein at least one of the first chamber and the second chamber includes a window transparent to optical illumination, the window configured to provide an optical pathway between the illumination source and the first surface of the membrane.

24. The image intensifier of claim 20, further comprising:
one or more optical elements configured to focus the illumination beam across the first surface of the membrane.

25. The image intensifier of claim 24, wherein the one or more optical elements comprise:
a variable focal length microarray.

26. The image intensifier of claim 20, wherein at least a portion of the membrane includes one or more graphene sheets of a selected thickness.

27. The image intensifier of claim 20, wherein at least a portion of the membrane includes at least a layer of a nanostructured film of a selected thickness.

28. The image intensifier of claim 20, wherein membrane comprises:
a membrane having a selected thickness and a selected surface area.

29. The image intensifier of claim 28, wherein the selected thickness is between 10 nm and 1000 nm.

30. The image intensifier of claim 20, wherein the TR photocathode is configured to receive illumination from the illumination source at oblique incident angles or normal incident angles.

31. An electron bombardment sensor, comprising:
a first chamber;
a second chamber;
a transmissive-reflective (TR) photocathode disposed between the first chamber and the second chamber, the TR photocathode comprising:
a membrane configured to absorb photons of an illumination beam from an illumination source via a first surface of the membrane, the membrane further configured to emit photoelectrons in a reflection mode via the first surface into the first chamber, the membrane further configured to emit photoelectrons in a transmissive mode via a second surface into the second chamber, the first surface and the second surface being substantially parallel; and
a membrane support structure configured to mechanically secure the membrane, the membrane support structure further configured to provide at least a first pathway between the first surface and the first chamber and a second pathway between the second surface and the second chamber;
a first detector configured to receive reflective mode photoelectrons emanating from the first surface of the membrane of the TR photocathode;
a second detector configured to receive transmissive mode photoelectrons emanating from the second surface of the membrane of the TR photocathode.

32. The electron bombardment sensor of claim 31, wherein at least one of the first detector and the second detector comprises:
at least one of a CCD detector and a CMOS detector.

33. The electron bombardment sensor of claim 31, wherein at least one of the first chamber and the second chamber includes a window transparent to optical illumination, the window configured to provide an optical pathway between the illumination source and the first surface of the membrane.

34. The electron bombardment sensor of claim 31, further comprising:
one or more optical elements configured to focus the illumination beam across the first surface of the membrane.

35. The electron bombardment sensor of claim 34, wherein the one or more optical elements comprise:
a variable focal length microarray.

36. The electron bombardment sensor of claim 31, wherein at least a portion of the membrane includes one or more graphene sheets of a selected thickness.

37. The electron bombardment sensor of claim 31, wherein at least a portion of the membrane includes at least a layer of a nanostructured film of a selected thickness.

38. The electron bombardment sensor of claim 31, wherein membrane comprises:
   a membrane having a selected thickness and a selected surface.

39. The electron bombardment sensor of claim 38, wherein the selected thickness is between 10 nm and 1000 nm.

40. The electron bombardment sensor of claim 31, wherein the TR photocathode is configured to receive illumination from the illumination source at oblique incident angles or normal incident angles.

41. An inspection system, comprising:
   an illumination source configured to illuminate a portion of a sample surface;
   a set of illumination optics configured to direct and focus the illumination onto the sample surface;
   a transmissive-reflective photocathode (TRP) based sensor configured to detect at least a portion of light scattered from the surface of the sample; and
   a set of collection optics configured to direct and focus at least a portion of light scattered from the surface of the sample onto the TR photocathode of TRP based sensor.

42. The inspection system of claim 41, wherein the transmissive-reflective photocathode based sensor comprises:
   a transmissive-reflective photocathode based photomultiplier tube (PMT) detector.

43. The inspection system of claim 41, wherein the transmissive-reflective photocathode based sensor comprises:
   a transmissive-reflective photocathode based image intensifier.

44. The inspection system of claim 41, wherein the transmissive-reflective photocathode based sensor comprises:
   a transmissive-reflective photocathode based electron bombardment sensor.

45. The inspection system of claim 41, wherein the inspection system is configured as a dark field inspection system.

46. The inspection system of claim 41, wherein the inspection system is configured as a bright field inspection system.

* * * * *